(12) United States Patent
Yamakoshi et al.

(10) Patent No.: US 7,740,718 B2
(45) Date of Patent: Jun. 22, 2010

(54) TARGET OF HIGH-PURITY NICKEL OR NICKEL ALLOY AND ITS PRODUCING METHOD

(75) Inventors: Yasuhiro Yamakoshi, Ibaraki (JP); Hirohito Miyashita, Ibaraki (JP)

(73) Assignee: Nippon Mining & Metals Co., Ltd., Tokyo (JP)

( * ) Notice: Subject to any disclaimer, the term of this patent is extended or adjusted under 35 U.S.C. 154(b) by 618 days.

(21) Appl. No.: 10/498,147

(22) PCT Filed: Nov. 28, 2002

(86) PCT No.: PCT/JP02/12438

§ 371 (c)(1),
(2), (4) Date: Jun. 8, 2004

(87) PCT Pub. No.: WO03/062487

PCT Pub. Date: Jul. 31, 2003

(65) Prior Publication Data

US 2004/0256035 A1 Dec. 23, 2004

(30) Foreign Application Priority Data

Jan. 18, 2002 (JP) .............................. 2002-009981

(51) Int. Cl.
*C22C 19/03* (2006.01)
(52) U.S. Cl. ...................... 148/426; 420/441
(58) Field of Classification Search ................. 148/426; 420/441
See application file for complete search history.

(56) References Cited

U.S. PATENT DOCUMENTS

| | | | |
|---|---|---|---|
| 4,900,638 A * | 2/1990 | Emmerich | 428/606 |
| 5,264,050 A | 11/1993 | Nakashima et al. | |
| 5,334,267 A | 8/1994 | Taniguchi et al. | 148/425 |
| 5,593,551 A * | 1/1997 | Lai | 204/192.12 |
| 5,964,966 A * | 10/1999 | Goyal et al. | 148/426 |
| 6,033,536 A | 3/2000 | Ichihara et al. | |
| 6,086,725 A * | 7/2000 | Abburi et al. | 204/192.1 |
| 6,190,516 B1 * | 2/2001 | Xiong et al. | 204/298.13 |
| 6,267,827 B1 | 7/2001 | Shindo et al. | |
| 6,342,114 B1 | 1/2002 | Lam et al. | 148/556 |
| 6,485,542 B2 | 11/2002 | Shindo et al. | 75/743 |
| 7,605,481 B2 | 10/2009 | Yamakoshi et al. | |
| 7,618,505 B2 | 11/2009 | Yamakoshi et al. | |
| 2004/0069652 A1 | 4/2004 | Shindo et al. | 205/596 |
| 2006/0037680 A1 | 2/2006 | Yamakoshi | |
| 2006/0137782 A1 | 6/2006 | Yamakoshi et al. | |
| 2006/0292028 A1 | 12/2006 | Shindo et al. | |
| 2007/0074790 A1 | 4/2007 | Yamakoshi et al. | |
| 2007/0098590 A1 | 5/2007 | Shindo | |

FOREIGN PATENT DOCUMENTS

| | | | |
|---|---|---|---|
| JP | 06-104120 | * | 4/1994 |
| JP | 09-157843 | | 6/1997 |
| WO | 01/94660 A2 | | 12/2001 |

OTHER PUBLICATIONS

Co-pending U.S. Appl. No. 10/540,638.
Patent Abstracts of Japan, 1 page English Abstract of JP 09-157843, Jun. 1997.
Hiroshi Kimura, "Concept of Material Strength", Agne Gijutsu Center, p. 134, Feb. 10, 2004.
C. Barrett et al., "Structure of Metals", 3rd Revised Edition, Pergamon Press, pp. 570-572, 1980 (month unknown).

* cited by examiner

*Primary Examiner*—Roy King
*Assistant Examiner*—Jessee R. Roe
(74) *Attorney, Agent, or Firm*—Howson & Howson LLP

(57) ABSTRACT

Provided is high purity nickel or nickel alloy target for magnetron sputtering having superior sputtering film uniformity and in which the magnetic permeability of the target is 100 or more, and this high purity nickel or a nickel alloy target for magnetron sputtering capable of achieving a favorable film uniformity (evenness of film thickness) and superior in plasma ignition (firing) even during the manufacturing process employing a 300 mm wafer. The present invention also provides the manufacturing method of such high purity nickel or nickel alloy target.

12 Claims, No Drawings

TARGET OF HIGH-PURITY NICKEL OR NICKEL ALLOY AND ITS PRODUCING METHOD

BACKGROUND OF THE INVENTION

The present invention relates to a nickel or nickel alloy sputtering target superior in film uniformity (evenness of film thickness) and plasma ignition (firing) performance, and the manufacturing method thereof.

The sputtering method is widely used as the method for forming a magnetic thin film on the likes of a hard disk magnetic recording medium, magnetic head, LSI chip and so on.

This sputtering method makes a positive electrode target and a negative electrode target face each other, and generates an electric field by applying a high voltage between the substrates thereof and the targets under an inert gas atmosphere. The sputtering method employs a fundamental principle where plasma is formed pursuant to the collision of electrons, which are ionized at such time, and the inert gas, the positive ion in this plasma extrudes the atoms structuring the target by colliding with the target surface, and the extruded atoms adhere to the opposing substrate surface, wherein the film is formed thereby.

For most of the sputtering performed today, a method referred to as magnetron sputtering is employed. This magnetron sputtering method sets a magnet on the back side of the target, and generates a magnetic field in the perpendicular direction with the electric field on the target surface in order to perform sputtering. As a result, enabled is the stabilization and high purification of plasma in such a perpendicular magnetic field space, and there is an advantage in that the sputtering speed can be increased.

Generally, this type of magnetron sputtering method is employed for forming on a substrate a magnetic thin film such as a ferromagnetic body or ferromagnetic body formed from Ni, Co or the like. Although the magnetron sputtering method is able to capture electrons within the magnetic field and efficiently ionize the sputtering gas, when the target is magnetic, the target itself affects the magnetic field in the vicinity of the sputtering face with its magnetic properties.

In recent years, particularly as the gate material, the use of nickel or nickel alloy has been proposed in place of cobalt since it possesses characteristics of having a low silicide forming temperature, electrical resistance of the film being low, silicon used in the silicide reaction being small, and so on.

In general, there is a problem in that it is extremely difficult to perform magnetron sputtering to a ferromagnetic body for magnetically creating a closed circuit. Nevertheless, recently, a ferromagnetic target formed from nickel or nickel alloy is also able to obtain sufficient deposition rate so as long as the thickness of the nickel or nickel alloy target is roughly 5 mm due to the improvement in the magnetron sputtering device employing the likes of a powerful magnet.

Nonetheless, to put it in other words, with a target formed from nickel or nickel alloy, there is a significant task of processing the target to obtain a thin and even film having thickness of 5 mm or less, preferably 3 mm or less.

Further, when employing a target having uneven magnetic properties within the sputtering face, the deepest part of the erosion portion will become strained, and there is a problem in that the scheduled film thickness distribution cannot be obtained. It could be said that a nickel or nickel alloy target, which is magnetic, particularly shows this kind of tendency.

With a flat rolled target material, the strain is not isotropic as a matter of course. In other words, it becomes an aggregate structure in which crystal grains are extended in one direction. Therefore, when viewing this three dimensionally, and even within the rolling face, anisotropy will arise in the magnetic properties.

Although a nickel or nickel alloy target employs magnetic anisotropy, it has a drawback in that strain or the like exists as is in the internal structure.

When cutting a discoid target from this kind of rolled sheet and preparing a target, the portion where erosion should progress by nature will be extended in one direction.

Fundamentally, upon performing deposition on a circular substrate, it was expected that the erosion portion would be circular by nature, and there is a problem in that an even film thickness could not be obtained on such a circular substrate.

In light of the above, since the thickness of deposition usually affects the magnetic properties, it is necessary to obtain a certain degree of film thickness and which is even. Nevertheless, the gate film may be thin, and the deposition rate and film thickness do not usually cause any problems.

In the foregoing deposition characteristics, however, the film uniformity (evenness of film thickness) significantly influences the properties of the gate film, and, in particular, this is becoming a major problem in the recent 300 mm wafer process.

The present invention was devised in view of the foregoing problems or drawbacks, and an object thereof is to provide a high purity nickel or nickel alloy target for magnetron sputtering capable of achieving a favorable film uniformity (evenness of film thickness) and superior in plasma ignition (firing) performance even during the manufacturing process employing a 300 mm wafer, as well as the manufacturing method thereof.

SUMMARY OF THE INVENTION.

In order to achieve the foregoing object, the present inventors discovered that, during the manufacture of a sputtering target, uniformity (evenness of film thickness) of the sputtering film can be improved when the magnetic permeability is higher, and, with additional improvements to the processing steps, the film uniformity (evenness of film thickness) can be further improved. As a result of performing magnetron sputtering with the high purity nickel or nickel alloy target obtained above, a high quality nickel or nickel alloy thin film can be obtained under stable manufacturing conditions and with favorable reproducibility.

Incidentally, the magnetic permeability described herein refers to the magnetic permeability in the direction parallel to the sputtering face (in-plane direction of target).

Based on the foregoing discovery, the present invention provides:

1. High purity nickel or nickel alloy target for magnetron sputtering having superior sputtering film uniformity, wherein the magnetic permeability of the target is 100 or more;
2. High purity nickel or nickel alloy target for magnetron sputtering having superior sputtering film uniformity according to paragraph 1 above, wherein the target does not contain coarse crystal grains which grew fivefold or more from the average crystal grain size;
3. A manufacturing method of high purity nickel or nickel alloy target for magnetron sputtering having superior sputtering film uniformity and in which the magnetic permeability of the target is 100 or more, comprising the steps of, after hot forging the high purity nickel or nickel alloy having a purity of 4N5 (99.995 wt %), cold rolling this at a rolling rate of 30% or more, and further performing heat treatment thereto for recrystallization at a temperature of 300° C. or higher, wherein the cold rolling and heat treatment are repeated at least two or more times;

4. A manufacturing method of high purity nickel or nickel alloy target for magnetron sputtering having superior sputtering film uniformity according to paragraph 3 above, wherein the purity is 5N (99.999 wt %) or more;
5. A manufacturing method of high purity nickel or nickel alloy target for magnetron sputtering having superior sputtering film uniformity according to paragraph 3 or paragraph 4 above, wherein kneading forge is performed upon hot forging the high purity nickel or nickel alloy;
6. A manufacturing method of high purity nickel or nickel alloy target for magnetron sputtering having superior sputtering film uniformity according to any one of paragraphs 3 to 5 above, wherein the target does not contain coarse crystal grains which grew fivefold or more from the average crystal grain size; and
7. A manufacturing method of high purity nickel or nickel alloy target for magnetron sputtering having superior sputtering film uniformity according to any one of paragraphs 3 to 6 above, wherein full annealing is ultimately performed at a temperature of 300° C. or higher and less than 600° C.

DETAILED DESCRIPTION OF THE INVENTION

Upon manufacturing a high purity nickel or nickel alloy target, foremost, high purity nickel or nickel alloy is formed into an ingot, and this is forged into a block (ingot).

Next, this is hot forged, and further cold rolled at a rolling rate of 30% or more, and heat treatment is performed thereto at a temperature of 400° C. or higher. In the present invention, the foregoing cold rolling and heat treatment are repeated at least two or more times. And, finally, this is processed into a flat plate shape or other target shapes that may be set in a magnetron sputtering device.

It is important that the magnetic permeability of this high purity nickel or nickel alloy is 100 or more, and this is a significant characteristic of the present invention. This can be achieved with the foregoing manufacturing process.

When the magnetic permeability is high, as described above, it is difficult for plasma to occur and will make sputtering difficult, and the magnetic permeability is generally devised to be as low as possible. Nevertheless, when the magnetic permeability is high, it has become known that the flux change will decrease as a result of the target shape changing due to the erosion caused by sputtering, and an effect is thereby yielded in that variations in the deposition evenness will decrease.

In other words, lower the magnetic permeability, the magnetic field leakage will increase, and the plasma density in the vicinity of the erosion portion will increase. Pursuant to this progress of erosion, the sputtering deposition of this portion will become enlarged, and the uniformity through the target life will change significantly as a result thereof.

The present invention improves the uniformity of the sputtering film by employing the effects yielded by the magnetic permeability being high, and is based on a technical spirit that is entirely different from conventional technical ideas.

Further, high purity nickel or nickel alloy is a soft material, easily generates abnormal grain growth, and tends to become an uneven metallographic structure in which coarse grains are mixed with fine grains. And, this uneven structure significantly affects the uniformity of the film.

Moreover, the mixture of such coarse grains within the structure of this kind of high purity nickel or nickel alloy target is also considered to adversely affect the ignition (firing) performance of plasma.

As described above, in order to form plasma suitable for magnetron sputtering, it is necessary to make the thickness of such nickel or nickel alloy target 5 mm or less, preferably around 3 mm. If an uneven structure of the target exists with the generation of abnormal grain growth, since the target is thin, this will significantly affect the overall target. As a result, the sputtering film uniformity and plasma ignition (firing) performance will deteriorate.

Therefore, it is desirable that coarse crystal grains having grown fivefold or more from the average crystal grain size are not included in the high purity nickel or nickel alloy target for magnetron sputtering. Thereby, the film uniformity and plasma ignition (firing) performance will further improve.

In order to obtain this kind of nickel or nickel alloy target having an even structure and which does not generate abnormal grain growth, as described above, it is important that an ingot with its solidification structure destroyed be subject to a repetition of performing two or more times cold rolling at a rolling rate of 30% or more and heat treatment at a temperature of 300° C. or higher in order to form this into a flat plate shape. In addition, as a result of repeating these processes, an effect is yielded in that the target plate can be made flat.

With the rolling rate at less than 30%, it is not possible to sufficiently destroy (disrupt) the coarse structure resulting from abnormal grain growth, and, with the temperature less than 300° C. the magnetic permeability will not become a significant value as perceived in the present invention. Thus, the range of heat treatment shall be 300° C. or higher.

Further, with a single performance of cold rolling at a rolling rate of 30% or more and heat treatment at a temperature of 300° C. or higher (even if this is only an 80% high deformation), it is not possible to sufficiently eliminate the coarse structure resulting from abnormal grain growth.

Therefore, this process must be repeated at least two or more times. Incidentally, this cold rolling and heat treatment do not have to be performed under the same conditions.

According to the foregoing process, it is possible to manufacture a high purity nickel or nickel alloy target for magnetron sputtering superior in film uniformity and plasma ignition (firing) performance.

As such high purity nickel or nickel alloy target, it is desirable to employ high purity nickel or nickel alloy having a purity of 4N5 (99.995 wt %), or preferably 5N (99.999 wt %) or more.

As the nickel alloy, Ni—Ti, Ni—Zr, Ni—Hf, Ni—V, Ni—Nb, Ni—Ta, Ni—Cr, Ni—Co, Ni—Pt, Ni—Pd, Ni—Ir, Ni—Fe, Ni—Mn and so on may be used. As the alloy element to be added, needless to say, the content should not be an amount in which the property as a ferromagnetic body will significantly change, and the additive amount should be roughly 0.5 to 7 at %.

Moreover, it is desirable that the average crystal grain size within the target be 20 to 1200 μm, and the variation of the average crystal grain size in the erosion face during sputtering be within a coefficient of variation of 20%.

As a result, it is possible to obtain a high purity nickel or nickel alloy target suitable for magnetron sputtering and superior in film uniformity throughout target life and plasma ignition (firing) performance.

With respect to the nickel alloys exemplified in the following Examples and Comparative Examples, although only a part of the foregoing nickel alloys is illustrated, similar results were obtained for all alloys.

EXAMPLES AND COMPARATIVE EXAMPLES

The present invention is now explained in detail with reference to the Examples and Comparative Examples. These Examples are merely illustrative, and the present invention shall in no way be limited thereby.

In other words, the present invention shall only be limited by the scope of claim for a patent, and shall include the various modifications other than the Examples of this invention.

Examples 1 to 5

Electron beam melting was performed to nickel having a purity of 99.995% as the raw material, and this was forged into an ingot (120 φ×70 h). After performing soaking treatment to the ingot (retaining the ingot for 2 hours at 900 to 1150° C.), hot forging (kneading forge) was performed thereto. The starting temperature of hot forging was 900° C. to 1150° C., and the true strain was approximately 5.

Cracks often occurred when hot forging was performed at a temperature less than 900° C., and, when the temperature exceeded 1150° C., oxidization of the material was significant. The temperature has been therefore set to be within the foregoing range.

This was cold rolled at a rolling rate of 30 to 60% and heat treated for 1 hour at 300° C. to 600° C. for recrystallization. Next, this was further cold rolled at a rolling rate of 30 to 60% and heat treated for 1 hour at 300 to 600° C. for recrystallization.

A sample was cut from the rolled sheet obtained above in order to form a discoid nickel target sample having a thickness of 3 mm and diameter of 440 mm. The average grain size of the target sample was 116 to 1215 μm as indicated in Table 1, and a target having a structure without any abnormal crystal grains was obtained. Further, this nickel target had a magnetic permeability of 121 to 255 and also possessed favorable flatness. Regarding structure observation and magnetic permeability measurement, an average value was obtained by measuring 17 points evenly with the target laid out radially. Similar measurements were carried out in the following Examples and Comparative Examples.

Next, this nickel target was used to perform magnetron sputtering to a 300 mm wafer, and the film uniformity (%, 3 σ) and plasma ignition (firing) performance were measured and observed. Moreover, with respect to film uniformity, a film of 1000 Å was formed on a new wafer per target life of approximately 5 kwh, and the calculation was based indirectly on the 49 points of resistance pursuant to the four terminal method.

Measurement results of the film uniformity were all 10% or less and continued up to a target life of 90 kwh (sputtering power of 1 kw), and showed superior film uniformity. The details are shown similarly shown in Table 1. Nevertheless, as the target life of 0 to 10 kWh showed some states of unstableness, these were placed outside the scope of measurement.

Further, in Table 1, although the plasma ignition (firing) performance is not shown, this was also favorable in each case.

TABLE 1

| | Forging Temperature (Starting Temperature ° C.) | Cold Rolling (%) | Heat Treatment (1st Time) | Cold Rolling (%) | Heat Treatment (2nd Time) | Crystal Structure (μm) | Coarse Crystal Grain | Co-efficient of Variation (%) | Magnetic Permeability | Film Uniformity (%, 3 σ) |
|---|---|---|---|---|---|---|---|---|---|---|
| Example 1 | 900 | 30 | 300° C. × 1 hr | 30 | 300° C. × 1 hr | 116 | None | 13.4 | 121 | 4 |
| Example 2 | 900 | 50 | 350° C. × 1 hr | 30 | 350° C. × 1 hr | 137 | None | 16.3 | 155 | 9.5 |
| Example 3 | 1150 | 40 | 400° C. × 1 hr | 60 | 400° C. × 1 hr | 323 | None | 17.2 | 185 | 7.5 |
| Example 4 | 1150 | 50 | 500° C. × 1 hr | 50 | 500° C. × 1 hr | 814 | None | 19.8 | 221 | 8 |
| Example 5 | 1150 | 60 | 600° C. × 1 hr | 30 | 600° C. × 1 hr | 1215 | None | 15.6 | 255 | 10 |
| Comparative Example 1 | 900 | 50 | 300° C. × 1 hr | None | None | 78 | Existed (440 μm) | 33 | 110 | 12 |
| Comparative Example 2 | 1000 | 60 | 500° C. × 1 hr | None | None | 191 | Existed (983 μm) | 44.3 | 180 | 14 |
| Comparative Example 3 | 1150 | 70 | 600° C. × 1 hr | None | None | 210 | Existed (1170 μm) | 45.3 | 192 | 15 |
| Comparative Example 4 | 950 | 80 | 400° C. × 1 hr | None | None | 105 | Existed (612 μm) | 65 | 161 | 19 |
| Comparative Example 5 | 1000 | 50 | 500° C. × 1 hr | None | None | 182 | Existed (912 μm) | 37 | 201 | 12 |
| Comparative Example 6 | 1050 | 60 | 600° C. × 1 hr | None | None | 305 | Existed (1710 μm) | 36.4 | 233 | 14 |
| Comparative Example 7 | 1100 | 70 | 400° C. × 1 hr | None | None | 120 | Existed (800 μm) | 67 | 250 | 18 |
| Comparative Example 8 | 900 | 80 | 600° C. × 1 hr | None | None | 371 | Existed (1960 μm) | 44.3 | 255 | 12 |

Note)
Regarding structure observation and magnetic permeability measurement, an average value was obtained by measuring 17 points evenly with the target laid out radially.

Note)
Comparative Examples 1 to 8 showed a tendency of the film uniformity aggravating abruptly from the point where the target life passes 40 kWh.

Comparative Examples 1 to 8

Similar to the Examples, electron beam melting was performed to nickel having a purity of 99.99% as the raw material, and this was forged into an ingot (120 φ×70 h). After performing soaking treatment to the ingot (retaining the ingot for 2 hours at 900 to 1150° C.), hot forging was performed thereto. The starting temperature of hot forging was 900° C. to 1150° C., and the true strain was approximately 5.

This was cold rolled at a rolling rate of 50 to 80% and heat treated for 1 hour at 300° C. to 600° C. Cold rolling and heat treatment were performed once.

A sample was cut from the rolled sheet obtained above in order to form a discoid nickel target sample having a thickness of 3 mm and diameter of 440 mm. Coarse crystal grains were observed in the target structure.

Next, this nickel target was used to perform magnetron sputtering under the same conditions as the Examples, and the film uniformity (%, 3 σ) and plasma ignition (firing) performance were measured and observed. Moreover, with respect to the measurement of film uniformity, the calculation was based indirectly on the value of resistance pursuant to the four terminal method.

Regarding the measurement results of film uniformity, the upper limit was within a range of 12 to 20, and the film uniformity showed significantly inferior results. The details are shown similarly shown in Table 1. In particular, Comparative Examples 1 to 8 showed a tendency of the film uniformity aggravating abruptly from the point where the target life passes 40 kWh.

Further, in Table 1, although the plasma ignition (firing) performance is not shown, this was also inferior in each case.

Examples 6 to 10

Electron beam melting was performed to nickel having a purity of 99.995% as the raw material. Separately, electron beam melting was performed to titanium having a purity of 99.995% as the raw material, 5 at % of titanium was added to the nickel, nickel-titanium alloy was formed by smelting this with a cold-wall type vacuum induction furnace, and this was forged into an ingot (120 φ×70 h).

After performing soaking treatment to the ingot (retaining the ingot for 2 hours at 750 to 1150° C.), hot forging was performed thereto. The starting temperature of hot forging was 750° C. to 1150° C., and the true strain was approximately 5. Cracks often occurred when hot forging was performed at a temperature less than 750° C., and, when the temperature exceeded 1150° C., oxidization of the material was significant. The temperature has been therefore set to be within the foregoing range.

This was cold rolled at a rolling rate of 30 to 60% and heat treated for 1 hour at 300° C. to 600° C. for recrystallization. Next, this was further cold rolled at a rolling rate of 30 to 60% and heat treated for 1 hour at 300 to 600° C. for recrystallization.

A sample was cut from the rolled sheet obtained above in order to form a discoid nickel alloy target sample having a thickness of 3 mm and diameter of 440 mm. The average grain size of the target sample was 24 to 850 μm as indicated in Table 2, and a target having a structure without any abnormal crystal grains was obtained. Further, this nickel alloy target had a magnetic permeability of 107 to 235 and also possessed favorable flatness.

Next, this nickel alloy target was used to perform magnetron sputtering, and the film uniformity (%, 3 σ) and plasma ignition (firing) performance were measured and observed. Moreover, with respect to the measurement of film uniformity, the calculation was based indirectly on the value of resistance pursuant to the four terminal method.

Measurement results of the film uniformity were all 10% or less and continued up to a target life of 90 kwh (sputtering power of 1 kw), and showed superior film uniformity. The details are shown similarly shown in Table 2.

Further, in Table 2, although the plasma ignition (firing) performance is not shown, this was also favorable in each case.

TABLE 2

| | Forging Temperature (Starting Temperature ° C.) | Cold Rolling (%) | Heat Treatment (1st Time) | Cold Rolling (%) | Heat Treatment (2nd Time) | Crystal Structure (μm) | Coarse Crystal Grain | Coefficient of Variation (%) | Magnetic Permeability | Film Uniformity (%, 3 σ) |
| --- | --- | --- | --- | --- | --- | --- | --- | --- | --- | --- |
| Example 6 | 750 | 30 | 300° C. × 1 hr | 30 | 300° C. × 1 hr | 23.5 | None | 10.5 | 107 | 9.8 |
| Example 7 | 900 | 50 | 350° C. × 1 hr | 30 | 350° C. × 1 hr | 75.3 | None | 12.2 | 122 | 9.5 |
| Example 8 | 1150 | 40 | 400° C. × 1 hr | 60 | 400° C. × 1 hr | 110.3 | None | 15.3 | 156 | 6.5 |
| Example 9 | 1150 | 50 | 500° C. × 1 hr | 50 | 500° C. × 1 hr | 620 | None | 17.5 | 189 | 9.5 |
| Example 10 | 1150 | 60 | 600° C. × 1 hr | 30 | 600° C. × 1 hr | 850 | None | 14.6 | 235 | 8.2 |
| Comparative Example 9 | 750 | 50 | 300° C. × 1 hr | None | None | 19.5 | Existed (123 μm) | 26 | 110 | 13 |
| Comparative Example 10 | 900 | 60 | 500° C. × 1 hr | None | None | 206 | Existed (1055 μm) | 29 | 182 | 14 |
| Comparative Example 11 | 1150 | 70 | 600° C. × 1 hr | None | None | 298 | Existed (1588 μm) | 64 | 205 | 19 |
| Comparative Example 12 | 750 | 80 | 400° C. × 1 hr | None | None | 110 | Existed (623 μm) | 29 | 150 | 17 |
| Comparative Example 13 | 900 | 50 | 500° C. × 1 hr | None | None | 210 | Existed (1225 μm) | 31 | 166 | 16 |
| Comparative Example 14 | 1050 | 60 | 600° C. × 1 hr | None | None | 205 | Existed (1150 μm) | 28 | 209 | 14 |
| Comparative Example 15 | 1150 | 70 | 400° C. × 1 hr | None | None | 89 | Existed (520 μm) | 46 | 132 | 15 |
| Comparative Example 16 | 750 | 80 | 600° C. × 1 hr | None | None | 230 | Existed (1365 μm) | 68 | 210 | 22 |

Note)
Regarding structure observation and magnetic permeability measurement, an average value was obtained by measuring 17 points evenly with the target laid out radially.

Note)
Comparative Examples 9 to 16 showed a tendency of the film uniformity aggravating abruptly from the point where the target life passes 30 kWh.

Comparative Examples 9 to 16

Electron beam melting was performed to nickel having a purity of 99.995% as the raw material. Separately, electron beam melting was performed to titanium having a purity of 99.995% as the raw material, 5 at % of titanium was added to the nickel, nickel-titanium alloy was formed by smelting this with a cold-wall type vacuum induction furnace, and this was forged into an ingot (120 φ×70 h).

After performing soaking treatment to the ingot (retaining the ingot for 2 hours at 750 to 1150° C.), hot forging was performed thereto. The starting temperature of hot forging was 750° C. to 1150° C., and the true strain was approximately 5. Cracks often occurred when hot forging was performed at a temperature less than 750° C., and, when the temperature exceeded 1150° C., oxidization of the material was significant. The temperature has been therefore set to be within the foregoing range.

This was cold rolled at a rolling rate of 50 to 80% and heat treated for 1 hour at 300° C. to 600° C. Cold rolling and heat treatment were performed once. A sample was cut from the rolled sheet obtained above in order to form a discoid nickel alloy target sample having a thickness of 3 mm and diameter of 440 mm. Coarse crystal grains were observed in the target structure.

Next, this nickel target was used to perform magnetron sputtering under the same conditions as the Examples, and the film uniformity (%, 3 σ) and plasma ignition (firing) performance were measured and observed. Moreover, with respect to the measurement of film uniformity, the calculation was based indirectly on the value of resistance pursuant to the four terminal method.

Regarding the measurement results of film uniformity, the upper limit was within a range of 13 to 22, and the film uniformity showed significantly inferior results. The details are shown similarly shown in Table 2. In particular, Comparative Examples 9 to 16 showed a tendency of the film uniformity aggravating abruptly from the point where the target life passes 30 kWh.

Further, in Table 2, although the plasma ignition (firing) performance is not shown, this was also inferior in each case.

Examples 11 to 15

Electron beam melting was performed to nickel having a purity of 99.995% as the raw material. Separately, electron beam melting was performed to manganese having a purity of 99.995% as the raw material, 0.5 at % of manganese was added to the nickel, nickel-manganese alloy was formed by smelting this with a cold-wall type vacuum induction furnace under an argon gas atmosphere, and this was forged into an ingot (120 φ×70 h).

After performing soaking treatment to the ingot (retaining the ingot for 2 hours at 750 to 1150° C.), hot forging was performed thereto. The starting temperature of hot forging was 750° C. to 1150° C., and the true strain was approximately 5. Cracks often occurred when hot forging was performed at a temperature less than 750° C., and, when the temperature exceeded 1150° C., oxidization of the material was significant. The temperature has been therefore set to be within the foregoing range.

This was cold rolled at a rolling rate of 30 to 60% and heat treated for 1 hour at 300° C. to 600° C. for recrystallization. Next, this was further cold rolled at a rolling rate of 30 to 60% and heat treated for 1 hour at 300 to 600° C. for recrystallization.

A sample was cut from the rolled sheet obtained above in order to form a discoid nickel alloy target sample having a thickness of 3 mm and diameter of 440 mm. The average grain size of the target sample was 62 to 1290 μm as indicated in Table 3, and a target having a structure without any abnormal crystal grains was obtained. Further, this nickel alloy target had a magnetic permeability of 105 to 215 and also possessed favorable flatness.

Next, this nickel alloy target was used to perform magnetron sputtering, and the film uniformity (%, 3 σ) and plasma ignition (firing) performance were measured and observed. Moreover, with respect to the measurement of film uniformity, the calculation was based indirectly on the value of resistance pursuant to the four terminal method.

Measurement results of the film uniformity were all 10% or less and continued up to a target life of 90 kwh (sputtering power of 1 kw), and showed superior film uniformity. The details are shown similarly shown in Table 3.

Further, in Table 3, although the plasma ignition (firing) performance is not shown, this was also favorable in each case.

TABLE 3

| | Forging Temperature (Starting Temperature ° C.) | Cold Rolling (%) | Heat Treatment (1st Time) | Cold Rolling (%) | Heat Treatment (2nd Time) | Crystal Structure (μm) | Coarse Crystal Grain | Coefficient of Variation (%) | Magnetic Permeability | Film Uniformity (%, 3 σ) |
|---|---|---|---|---|---|---|---|---|---|---|
| Example 11 | 750 | 30 | 300° C. × 1 hr | 30 | 300° C. × 1 hr | 62 | None | 15.6 | 105 | 7.2 |
| Example 12 | 900 | 50 | 350° C. × 1 hr | 30 | 350° C. × 1 hr | 75.3 | None | 13.4 | 122 | 8.2 |
| Example 13 | 1150 | 40 | 400° C. × 1 hr | 60 | 400° C. × 1 hr | 110.3 | None | 15.3 | 136 | 6.5 |
| Example 14 | 1150 | 50 | 500° C. × 1 hr | 50 | 500° C. × 1 hr | 690 | None | 18.3 | 170 | 7.5 |
| Example 15 | 1150 | 60 | 600° C. × 1 hr | 30 | 600° C. × 1 hr | 1290 | None | 19.5 | 215 | 8.1 |
| Comparative Example 17 | 750 | 50 | 300° C. × 1 hr | None | None | 36 | Existed (189 μm) | 35 | 105 | 21 |
| Comparative Example 18 | 900 | 60 | 500° C. × 1 hr | None | None | 142 | Existed (850 μm) | 29 | 190 | 17 |
| Comparative Example 19 | 1150 | 70 | 600° C. × 1 hr | None | None | 177 | Existed (980 μm) | 70.2 | 220 | 19 |
| Comparative Example 20 | 750 | 80 | 400° C. × 1 hr | None | None | 42 | Existed (213 μm) | 38 | 154 | 17 |
| Comparative Example 21 | 900 | 50 | 500° C. × 1 hr | None | None | 135 | Existed (680 μm) | 42 | 177 | 16 |

TABLE 3-continued

|  | Forging Temperature (Starting Temperature ° C.) | Cold Rolling (%) | Heat Treatment (1st Time) | Cold Rolling (%) | Heat Treatment (2nd Time) | Crystal Structure (μm) | Coarse Crystal Grain | Coefficient of Variation (%) | Magnetic Permeability | Film Uniformity (%, 3 σ) |
|---|---|---|---|---|---|---|---|---|---|---|
| Comparative Example 22 | 1050 | 60 | 600° C. × 1 hr | None | None | 184 | Existed (960 μm) | 36 | 209 | 15 |
| Comparative Example 23 | 1150 | 70 | 400° C. × 1 hr | None | None | 49 | Existed (260 μm) | 75 | 145 | 15 |
| Comparative Example 24 | 750 | 80 | 600° C. × 1 hr | None | None | 193 | Existed (1010 μm) | 60 | 175 | 25 |

Note)
Regarding structure observation and magnetic permeability measurement, an average value was obtained by measuring 17 points evenly with the target laid out radially.
Note)
Comparative Examples 17 to 24 showed a tendency of the film uniformity aggravating abruptly from the point where the target life passes 30 kWh.

Comparative Examples 17 to 24

Electron beam melting was performed to nickel having a purity of 99.995% as the raw material. Separately, electron beam melting was performed to manganese having a purity of 99.995% as the raw material, 0.5 at % of manganese was added to the nickel, nickel-manganese alloy was formed by smelting this with a cold-wall type vacuum induction furnace under an argon gas atmosphere, and this was forged into an ingot (120 φ×70 h).

After performing soaking treatment to the ingot (retaining the ingot for 2 hours at 750 to 1150° C.), hot forging was performed thereto. The starting temperature of hot forging was 750° C. to 1150° C., and the true strain was approximately 5. Cracks often occurred when hot forging was performed at a temperature less than 750° C., and, when the temperature exceeded 1150° C., oxidization of the material was significant. The temperature has been therefore set to be within the foregoing range.

This was cold rolled at a rolling rate of 50 to 80% and heat treated for 1 hour at 300° C. to 600° C. Cold rolling and heat treatment were performed once.

A sample was cut from the rolled sheet obtained above in order to form a discoid nickel alloy target sample having a thickness of 3 mm and diameter of 440 mm. Coarse crystal grains were observed in the target structure.

Next, this nickel target was used to perform magnetron sputtering under the same conditions as the Examples, and the film uniformity (%, 3 σ) and plasma ignition (firing) performance were measured and observed. Moreover, with respect to the measurement of film uniformity, the calculation was based indirectly on the value of resistance pursuant to the four terminal method.

Regarding the measurement results of film uniformity, the upper limit was within a range of 15 to 25, and the film uniformity showed significantly inferior results. The details are shown similarly shown in Table 3. In particular, Comparative Examples 17 to 24 showed a tendency of the film uniformity aggravating abruptly from the point where the target life passes 30 kWh.

Further, in Table 3, although the plasma ignition (firing) performance is not shown, this was also inferior in each case.

The high purity nickel or nickel alloy target, and the manufacturing method thereof, for magnetron sputtering according to the present invention has even crystal grains and does not have any abnormal crystal grains, and yields a superior effect in that it is capable of improving the film uniformity (evenness of film) and plasma ignition (firing) performance even during the deposition process employing a 300 mm water.

The invention claimed is:

1. A sputtering target for magnetron sputtering, comprising:
   a nickel alloy sputtering target consisting essentially of nickel and an alloy element, said alloy element being selected from a group consisting of Ti, Zr, Hf, V, Nb, Ta, Cr, Co, Pt, Pd, Ir, Fe and Mn, a content of said alloy element within said nickel alloy of said target being 0.5 to 7 at % with the remainder 93 to 99.5 at % being nickel;
   said target having a thickness of 5 mm or less, a magnetic permeability of 100 or more, an average crystal grain size within said target of 20 to 1200 μm, and an even metallographic structure without coarse crystal grains that are fivefold or more in growth from said average crystal grain size; and
   said nickel alloy of said target having a purity of 5N (99.999 wt %) or more.

2. A sputtering target according to claim 1, wherein said thickness of said target is 3 mm.

3. A sputtering target according to claim 1, wherein said target has an erosion face that has an average crystal grain size within a coefficient of variation of 20% from said average crystal grain size within said target.

4. A sputtering target according to claim 1, wherein said sputtering target has a sputtering face, and wherein said magnetic permeability of 100 or more is in a direction parallel to said sputtering face.

5. A sputtering target according to claim 1, wherein said alloy element is selected from a group consisting of Zr, Hf, Co, Pt, Pd, Ir, Fe and Mn.

6. A sputtering target for magnetron sputtering, comprising:
   a nickel alloy sputtering target having a discoid-shape defining a sputtering face and being of a thickness of 5mm or less and a predetermined diameter;
   said nickel alloy sputtering target consisting essentially of 93 to 99.5 at % nickel and 0.5 to 7 at % of an alloy element, said alloy element being selected from a group consisting of Ti, Zr, Hf, V, Nb, Ta, Cr, Co, Pt, Pd, Ir, Fe and Mn;
   said target having a magnetic permeability in a direction parallel to said sputtering face of 100 or more, an average crystal grain size of 20 to 1200 μm, and an even metallographic structure without coarse crystal grains that are fivefold or more in growth from said average crystal grain size; and
   said nickel alloy of said target having a purity of 5N (99.999 wt %) or more.

7. A sputtering target according to claim 6, wherein said thickness is 3 mm.

8. A sputtering target according to claim 7, wherein said predetermined diameter is 440 mm.

9. A sputtering target according to claim 6, wherein said allay element is selected from a group consisting of Zr, Hf, Co, Pt, Pd, Ir, Fe and Mn.

10. A sputtering target for magnetron sputtering, comprising:
    a nickel alloy sputtering target having a sputtering face;
    said nickel alloy sputtering target consisting of nickel and 0.5 to 7 at % of an alloy element selected from the group consisting of Zr, Hf, Co, Pt, Pd, Ir, Fe and Mn; and
    said target having a magnetic permeability in a direction parallel to said sputtering face of 100 or more, an average crystal grain size of 20 to 1200 µm, and an even metallographic structure without coarse crystal grains that are fivefold or more in growth from said average crystal grain size.

11. A sputtering target according to claim 10, wherein said nickel alloy of said target has a purity of 5N (99.999 wt %) or more.

12. A sputtering target according to claim 11, wherein said target has a thickness of 3 mm.

* * * * *

UNITED STATES PATENT AND TRADEMARK OFFICE
CERTIFICATE OF CORRECTION

PATENT NO. : 7,740,718 B2  Page 1 of 1
APPLICATION NO. : 10/498147
DATED : June 22, 2010
INVENTOR(S) : Yasuhiro Yamakoshi et al.

It is certified that error appears in the above-identified patent and that said Letters Patent is hereby corrected as shown below:

Column 13, line 6, --allay element-- should read --alloy element--

Signed and Sealed this

Seventh Day of September, 2010

David J. Kappos
*Director of the United States Patent and Trademark Office*